US010429430B2

(12) United States Patent
Wuerstlein et al.

(10) Patent No.: US 10,429,430 B2
(45) Date of Patent: Oct. 1, 2019

(54) METHOD FOR OPERATING A CAPACITIVE SENSOR ARRANGEMENT OF A MOTOR VEHICLE (71) Applicant: Brose Fahrzeugteile GmbH & Co. KG, Bamberg, Bamberg (DE)

(72) Inventors: Holger Wuerstlein, Zeil am Main (DE); Detlef Russ, Ebersdorf (DE)

(73) Assignee: Brose Fahrzeugteile GmbH & Co. KG, Bamberg, Bamberg (DE)

( * ) Notice: Subject to any disclaimer, the term of this patent is extended or adjusted under 35 U.S.C. 154(b) by 176 days.

(21) Appl. No.: 15/351,913

(22) Filed: Nov. 15, 2016

(65) Prior Publication Data

US 2017/0138997 A1 May 18, 2017

(30) Foreign Application Priority Data

Nov. 15, 2015 (DE) .................. 10 2015 119 701

(51) Int. Cl.
G01R 31/04 (2006.01)
G01B 7/02 (2006.01)
H03K 17/955 (2006.01)

(52) U.S. Cl.
CPC ............ *G01R 31/04* (2013.01); *G01B 7/023* (2013.01); *H03K 17/955* (2013.01); *H03K 2217/960705* (2013.01)

(58) Field of Classification Search
CPC ...... G01R 31/04; G01B 7/023; H03K 17/955; H03K 2217/960705

(Continued)

(56) References Cited

U.S. PATENT DOCUMENTS 2,127,359 A 8/1938 Harley et al.
5,351,519 A 10/1994 Kress et al.
(Continued)

FOREIGN PATENT DOCUMENTS

CN 101809415 8/2010
CN 102067450 5/2011
(Continued)

OTHER PUBLICATIONS

Non-Final Office Action for U.S. Appl. No. 14/367,786 dated Feb. 14, 2018 (15 pages).
Brose Fahrzeugteile Gmbh & CO.KG, "Sesam oeffne Dich. In: AutomobilKONSTRUKTION," Feb. 2012 (pp. 50-51), with English translation, 4 pages.
European Search Report for EP Application No. 13713812.2 corresponding to U.S. Appl. No. 13/951,163 dated Oct. 31, 2013 (3 pages).

(Continued)

Primary Examiner — Patrick Assouad
Assistant Examiner — Sean Curtis
(74) Attorney, Agent, or Firm — Pauly, DeVries Smith & Deffner LLC (57) ABSTRACT The disclosure relates to a method for operating a capacitive sensor arrangement of a motor vehicle, a control unit being provided, the sensor arrangement having at least one electrode and a connection arrangement which is assigned to the electrode and has a connecting line and, on the latter, a connection on the electrode side and a connection on the control unit side, the electrode being controlled during a measurement routine by the control unit and the resulting distance values being determined on the basis of a measurement capacitance formed by the electrode with respect to a reference potential, the electrical connection state of the electrode being checked with respect to the connection to the control unit during a diagnostic routine by the control unit. It is proposed that the connection state is checked during the diagnostic routine by the control unit.

20 Claims, 4 Drawing Sheets (58) Field of Classification Search
USPC .................. 324/519, 538, 658, 661, 686
See application file for complete search history.

(56) References Cited

U.S. PATENT DOCUMENTS

| | | | |
|---|---|---|---|
| 5,394,292 A * | 2/1995 | Hayashida | B60R 19/483 |
| | | | 180/274 |
| 5,844,486 A | 12/1998 | Barron et al. | |
| 5,929,769 A | 7/1999 | Garnault | |
| 5,959,456 A * | 9/1999 | Whorlow | G01B 7/023 |
| | | | 324/662 |
| 6,275,146 B1 | 8/2001 | Kithil et al. | |
| 6,337,549 B1 | 1/2002 | Bledin | |
| 6,478,357 B2 | 11/2002 | Zhou | |
| 7,217,891 B2 * | 5/2007 | Fischer | B60N 2/002 |
| | | | 177/144 |
| 7,688,013 B2 * | 3/2010 | Frommer | E05F 15/43 |
| | | | 318/266 |
| 7,768,272 B2 * | 8/2010 | Kato | H03K 17/955 |
| | | | 324/663 |
| 7,880,481 B2 | 2/2011 | Zangl et al. | |
| 8,027,769 B2 | 9/2011 | Zander et al. | |
| 8,225,458 B1 | 7/2012 | Hoffberg et al. | |
| 8,284,022 B2 | 10/2012 | Kachouh | |
| 8,606,467 B2 | 12/2013 | Gehin | |
| 8,692,565 B2 * | 4/2014 | Togura | H03K 17/955 |
| | | | 324/600 |
| 8,723,532 B2 | 5/2014 | Asjes et al. | |
| 8,788,152 B2 | 7/2014 | Reimann et al. | |
| 8,823,394 B2 * | 9/2014 | Reime | H03K 17/955 |
| | | | 324/658 |
| 8,966,825 B2 * | 3/2015 | Uebelein | B60J 5/0416 |
| | | | 49/25 |
| 8,970,232 B2 * | 3/2015 | Kandler | B60N 2/002 |
| | | | 324/660 |
| 9,081,032 B2 | 7/2015 | Lange | |
| 9,274,154 B2 * | 3/2016 | Togura | G01R 27/2605 |
| 9,283,994 B2 | 3/2016 | Holzberg et al. | |
| 9,290,982 B2 | 3/2016 | Schuetz et al. | |
| 9,304,156 B2 * | 4/2016 | Weingaertner | B60R 25/2054 |
| 9,541,590 B2 * | 1/2017 | Geuther | G01R 27/2605 |
| 9,543,674 B2 * | 1/2017 | Wuerstlein | H01R 12/7076 |
| 9,574,388 B2 | 2/2017 | Ebert | |
| 9,585,280 B2 * | 2/2017 | Wuerstlein | G01R 27/2605 |
| 9,587,417 B2 | 3/2017 | Van et al. | |
| 9,689,982 B2 | 6/2017 | Herthan | |
| 9,702,682 B2 * | 7/2017 | Kuhnen | G01B 7/023 |
| 9,731,627 B2 | 8/2017 | Lamesch et al. | |
| 9,845,629 B2 | 12/2017 | Washeleski et al. | |
| 9,939,956 B2 * | 4/2018 | Roziere | G06F 3/044 |
| 9,995,601 B2 * | 6/2018 | Wuerstlein | G01N 27/221 |
| 10,107,851 B2 | 10/2018 | Reimann | |
| 2002/0030666 A1 | 3/2002 | Philipp et al. | |
| 2002/0143452 A1 | 10/2002 | Losey et al. | |
| 2004/0085079 A1 | 5/2004 | Lin et al. | |
| 2004/0178924 A1 | 9/2004 | Gifford et al. | |
| 2005/0114276 A1 | 5/2005 | Hunter et al. | |
| 2005/0231194 A1 | 10/2005 | Baldi et al. | |
| 2006/0267374 A1 | 11/2006 | Jackson et al. | |
| 2006/0293800 A1 | 12/2006 | Bauer et al. | |
| 2007/0072154 A1 | 3/2007 | Akatsuka et al. | |
| 2007/0102220 A1 | 5/2007 | Kiribayashi | |
| 2007/0296242 A1 * | 12/2007 | Frommer | E05F 15/43 |
| | | | 296/146.4 |
| 2008/0068145 A1 | 3/2008 | Weghaus et al. | |
| 2008/0088188 A1 | 4/2008 | Busch et al. | |
| 2008/0122454 A1 * | 5/2008 | Kato | G01D 3/032 |
| | | | 324/661 |
| 2008/0195273 A1 | 8/2008 | Matsuura et al. | |
| 2008/0211519 A1 * | 9/2008 | Kurumado | G01D 5/24 |
| | | | 324/688 |
| 2008/0303685 A1 | 12/2008 | Nakano et al. | |
| 2009/0222174 A1 | 9/2009 | Frommer et al. | |
| 2009/0243826 A1 | 10/2009 | Touge et al. | |
| 2010/0079283 A1 | 4/2010 | Hammerschmidt et al. | |
| 2010/0256875 A1 | 10/2010 | Gehin et al. | |
| 2010/0259283 A1 * | 10/2010 | Togura | H03K 17/955 |
| | | | 324/679 |
| 2010/0289506 A1 | 11/2010 | Moon et al. | |
| 2011/0084709 A1 | 4/2011 | Asjes et al. | |
| 2011/0118946 A1 | 5/2011 | Reimann et al. | |
| 2011/0133756 A1 * | 6/2011 | Reime | H03K 17/955 |
| | | | 324/658 |
| 2011/0234370 A1 | 9/2011 | Briese et al. | |
| 2011/0254572 A1 * | 10/2011 | Yamaguchi | B60R 25/00 |
| | | | 324/688 |
| 2011/0276234 A1 | 11/2011 | Van Gastel | |
| 2011/0313619 A1 | 12/2011 | Washeleski et al. | |
| 2012/0188078 A1 | 7/2012 | Soles et al. | |
| 2012/0290177 A1 | 11/2012 | Wagenhuber et al. | |
| 2013/0187664 A1 | 7/2013 | Deumal Herraiz et al. | |
| 2013/0193989 A1 * | 8/2013 | Kuhnen | G01B 7/023 |
| | | | 324/662 |
| 2013/0207677 A1 * | 8/2013 | Togura | G01R 27/2605 |
| | | | 324/685 |
| 2013/0234733 A1 | 9/2013 | Lange et al. | |
| 2013/0234828 A1 | 9/2013 | Holzberg et al. | |
| 2013/0311039 A1 | 11/2013 | Washeleski et al. | |
| 2013/0321006 A1 * | 12/2013 | Weingaertner | B60R 25/2054 |
| | | | 324/679 |
| 2014/0032055 A1 | 1/2014 | Holzberg et al. | |
| 2014/0195073 A1 | 7/2014 | Herthan | |
| 2014/0285217 A1 | 9/2014 | Van Gastel et al. | |
| 2014/0324273 A1 | 10/2014 | Russ et al. | |
| 2014/0373447 A1 * | 12/2014 | Gunreben | G07C 9/00309 |
| | | | 49/31 |
| 2015/0012176 A1 * | 1/2015 | Schindler | B60W 50/08 |
| | | | 701/36 |
| 2015/0019085 A1 | 1/2015 | Ma | |
| 2015/0035549 A1 * | 2/2015 | Sugiura | H03K 17/955 |
| | | | 324/663 |
| 2015/0070033 A1 * | 3/2015 | Pohl | G01R 27/2605 |
| | | | 324/663 |
| 2015/0128497 A1 | 5/2015 | Schuetz et al. | |
| 2015/0134208 A1 | 5/2015 | Gunreben | |
| 2015/0176322 A1 * | 6/2015 | Wuerstlein | B60J 5/047 |
| | | | 701/49 |
| 2015/0176323 A1 | 6/2015 | Ebert | |
| 2015/0176324 A1 | 6/2015 | Ebert | |
| 2015/0219703 A1 * | 8/2015 | Geuther | G01R 27/2605 |
| | | | 324/686 |
| 2015/0233167 A1 | 8/2015 | Hiroshi | |
| 2015/0241195 A1 * | 8/2015 | Schenkewitz | H03K 17/975 |
| | | | 324/658 |
| 2015/0258879 A1 | 9/2015 | Mandzak | |
| 2015/0267454 A1 * | 9/2015 | Wuerstlein | E05F 15/46 |
| | | | 701/49 |
| 2015/0330767 A1 * | 11/2015 | Pohl | H03K 17/955 |
| | | | 324/671 |
| 2015/0345205 A1 * | 12/2015 | Gunreben | E05F 15/77 |
| | | | 701/2 |
| 2016/0043486 A1 * | 2/2016 | Wuerstlein | H01R 12/7076 |
| | | | 439/78 |
| 2016/0057882 A1 * | 2/2016 | Wuerstlein | G01R 27/2605 |
| | | | 361/752 |
| 2016/0245671 A1 * | 8/2016 | Wuerstlein | G01N 27/221 |
| 2016/0265263 A1 | 9/2016 | Motoki et al. | |
| 2017/0138997 A1 * | 5/2017 | Wuerstlein | G01R 31/04 |
| 2017/0190309 A1 * | 7/2017 | Herthan | B60R 25/2054 |
| 2017/0235413 A1 * | 8/2017 | Koizumi | G06F 3/044 |
| | | | 345/174 |
| 2017/0241187 A1 * | 8/2017 | Takayanagi | E05F 15/632 |

FOREIGN PATENT DOCUMENTS

| | | | |
|---|---|---|---|
| CN | 107064721 A * | 8/2017 | ............ G01R 31/04 |
| DE | 4133426 | 8/1993 | |
| DE | 4408468 | 9/1995 | |
| DE | 10235925 | 2/2004 | |
| DE | 10254708 | 6/2004 | |
| DE | 102004055985 | 4/2006 | |

(56) References Cited

FOREIGN PATENT DOCUMENTS

| | | | |
|---|---|---|---|
| DE | 102004055982 | 6/2006 | |
| DE | 102004057220 | 6/2006 | |
| DE | 102005032402 | 9/2006 | |
| DE | 102005042402 | 3/2007 | |
| DE | 102005055002 | 5/2007 | |
| DE | 202005020140 | 6/2007 | |
| DE | 10158533 | 2/2009 | |
| DE | 102008061225 | 7/2009 | |
| DE | 102009004384 | 7/2009 | |
| DE | 102009017404 | 11/2009 | |
| DE | 102008041354 | 2/2010 | |
| DE | 102009041555 | 6/2010 | |
| DE | 102008063366 | 7/2010 | |
| DE | 102009047066 | 5/2011 | |
| DE | 102009055778 | 6/2011 | |
| DE | 102010048144 | 7/2011 | |
| DE | 102010006213 | 8/2011 | |
| DE | 102010002559 | 9/2011 | |
| DE | 102010037577 | 3/2012 | |
| DE | 102010049400 | 4/2012 | |
| DE | 102010055297 | 6/2012 | |
| DE | 102011051434 | 1/2013 | |
| DE | 102011121775 | 1/2013 | |
| DE | 102011112274 | 3/2013 | |
| DE | 102013200871 | 7/2013 | |
| DE | 102012104915 | 12/2013 | |
| DE | 102012013065 | 1/2014 | |
| DE | 102013112418 | 5/2015 | |
| DE | 102013112418 A1 * | 5/2015 | ............... G01D 5/24 |
| DE | 102013114881 | 6/2015 | |
| DE | 102015119701 A1 * | 5/2017 | ............. G01R 31/04 |
| EP | 0711977 | 5/1996 | |
| EP | 1422366 | 5/2004 | |
| EP | 2285629 | 3/2012 | |
| EP | 3171124 A1 * | 5/2017 | ............. G01R 31/04 |
| EP | 3171124 B1 * | 6/2018 | |
| FR | 2943190 | 9/2010 | |
| GB | 2376075 | 12/2002 | |
| JP | 02055168 | 2/1990 | |
| JP | 6018547 | 1/1994 | |
| JP | 2002514986 | 5/2002 | |
| JP | 2007228640 | 9/2007 | |
| JP | 2009079353 | 4/2009 | |
| JP | 2010531268 | 9/2010 | |
| JP | 2010236184 | 10/2010 | |
| KR | 20170057142 A * | 5/2017 | ............. G01R 31/04 |
| WO | 2005084979 | 9/2005 | |
| WO | 2007/006514 | 1/2007 | |
| WO | 2010060767 | 6/2010 | |
| WO | 2010076332 | 7/2010 | |
| WO | 2011092206 | 8/2011 | |
| WO | 2012052210 | 4/2012 | |
| WO | 2012/084111 | 6/2012 | |
| WO | WO-2013000805 A1 * | 1/2013 | ......... B60R 25/2054 |
| WO | 2013034252 | 3/2013 | |
| WO | 2013091839 | 6/2013 | |
| WO | WO-2013091839 A2 * | 6/2013 | ......... G07C 9/00309 |

OTHER PUBLICATIONS

"Final Office Action," for U.S. Appl. No. 14/367,786 dated Oct. 31, 2016 (19 pages).

German Search Report for DE Application No. 102011112274.9 corresponding to U.S. Appl. No. 14/343,005, dated May 9, 2012 (4 pages).

German Search Report for German Patent Application No. 102013114883.2, dated Feb. 4, 2014 (5 pages).

International Search Report and Written Opinion for PCT/EP2013/063905 related to U.S. Appl. No. 14/412,511, dated Aug. 1, 2013 (8 pages) [English Translation].

International Search Report for application No. PCT/EP2013/066998 corresponding to U.S. Appl. No. 14/343,005, dated Oct. 26, 2012 (6 pages).

International Search Report for PCT/EP2012/005234 related to U.S. Appl. No. 14/367,786, dated Jun. 14, 2013 (3 pages).

International Written Opinion for PCT/EP2012/005234 related to U.S. Appl. No. 14/367,786, completed Jun. 7, 2014 (10 pages).

Non Final Office Action for U.S. Appl. No. 14/367,786 dated Feb. 1, 2016 (15 pages).

Non Final Office Action for U.S. Appl. No. 14/343,005, dated Feb. 11, 2016 (23 pages).

Non Final Office Action for U.S. Appl. No. 13/951,163, dated Dec. 17, 2014 (31 pages).

Non-Final Office Action for U.S. Appl. No. 14/412,511, dated Apr. 11, 2016 (20 pages).

Non-Final Office Action for U.S. Appl. No. 14/581,441, dated Jun. 3, 2016 (10 pages).

Notice of Allowance for U.S. Appl. No. 13/951,163 dated Nov. 6, 2015 (13 pages).

Notice of Allowance for U.S. Appl. No. 13/951,163, dated May 26, 2015 (16 pages).

Office Action for KR Patent Application No. 10-2013-0087175 corresponding to U.S. Appl. No. 13/951,163 completed Jan. 21, 2015 (13 pages).

Restriction Requirement for U.S. Appl. No. 14/367,786 dated Nov. 3, 2015 (8 pages).

Search Report for German Application No. 102012014676.0 corresponding to U.S. Appl. No. 13/951,163, dated Jan. 18, 2013 (5 pages).

Search Report for German Patent Application No. 102012013065.1 related to U.S. Appl. No. 14/412,511, dated Jun. 28, 2013 (5 pages).

Non-Final Office Action for U.S. Appl. No. 14/367,786 dated Mar. 1, 2019 (13 pages).

Final Office Action for U.S. Appl. No. 14/367,786 dated Oct. 9, 2018 (10 pages).

Response to Final Rejection dated Oct. 9, 2018, for U.S. Appl. No. 14/367,786, submitted via EFS-Web on Feb. 11, 2019, 8 pages.

Response to Non-Final Rejection dated Feb. 14, 2018, for U.S. Appl. No. 14/367,786, submitted via EFS-Web on Aug. 14, 2018, 11 pages.

Opposition Proceedings mailed on Mar. 29, 2019, for EP16195945.7 (related to U.S. Appl. No. 15/351,913), 5 pages.

* cited by examiner

METHOD FOR OPERATING A CAPACITIVE SENSOR ARRANGEMENT OF A MOTOR VEHICLE

CLAIM OF PRIORITY

This application claims the benefit of German Utility Model No. DE 10 2015 119 701.4 filed on Nov. 15, 2015, the disclosure of which is incorporated herein by reference.

FIELD OF THE TECHNOLOGY

The application relates to a method for operating a capacitive sensor arrangement of a motor vehicle, to a control unit for controlling a capacitive sensor arrangement of a motor vehicle, and to a sensor system of a motor vehicle.

BACKGROUND

Capacitive sensor arrangements are used in various areas of a motor vehicle. One example is the detection of an operating event, in particular approach of a person to the motor vehicle, which, depending on the design, may initiate an authentication dialog. Another example is the detection of an imminent collision between a person and a moving component, for example a tailgate, of the motor vehicle.

The method in question relates to the operation of a capacitive sensor arrangement of a motor vehicle which is used to determine distance values to a measurement object. For this purpose, the sensor arrangement is assigned a control unit for controlling it. The sensor arrangement has two electrodes each assigned a connection arrangement for connection to the control unit. The fault-free connection between the electrodes and the control unit is of very special importance in order to avoid distance values being incorrectly determined on account of high contact resistances, for example.

In the known method for operating a capacitive sensor arrangement of a motor vehicle (DE 10 2013 112 418 A1), on which the present invention is based, a diagnostic routine is provided in order to check the electrical connection state of the electrode with respect to the electrical connection to the control unit. In this case, the check of the electrical connection state quite generally traces back to a check of the electrical resistance of diagnostic paths inside the sensor arrangement. Although the known method makes it possible to reliably detect fault states, the known method always requires that the electrodes each make contact with two connecting lines in order to be able to check the relevant resistance.

SUMMARY

The disclosure is based on the problem of configuring and developing the known method in such a manner that the check of the connection state of the respective electrode is simplified. In the case of a method as described herein, the above problem is solved.

The important factor is the fundamental consideration that a change in the electrical connection between the relevant electrode and the control unit is always also associated with a corresponding change in the magnitude and/or charging behavior of the respective input capacitance between the connection on the control unit side and the reference potential. On the one hand, this is due to the fact that the supply line to the input capacitance can have an increased nonreactive resistance as a result of a faulty electrical connection, which influences the charging behavior of the input capacitance. On the other hand, an electrical interruption inside the electrode or inside a connecting line may result in the magnitude of the input capacitance itself being changed, usually reduced. Both faults can be quite generally detected during the diagnostic routine by using the control unit to check the connection state on the basis of the input capacitance between the connection on the control unit side and the reference potential, in particular on the basis of the capacitive portion of the input impedance between the connection on the control unit side and the reference potential. In this case, it is particularly advantageous that the input capacitance and therefore the connection state can be checked using only a single connecting line since the input capacitance or the input impedance with respect to the reference potential, here ground potential, is available.

In the present case, the term "connection" can be broadly understood. It can relate to any point in the connection between the electrode and the control unit. In this sense, a connection can, but need not, be releasable. However, the connection can be a pluggable connection. The term "connection arrangement" can also be accordingly broadly understood, the connections of which connection arrangement can be arranged on the connecting line or can be coupled to the connecting line indirectly, for example via electrical circuits.

In the present case, the term "control unit" can also be broadly understood. The control unit may be, in principle, a discrete or integrated electrical control circuit, upstream or downstream of which different control circuits can be connected.

In an embodiment, a check is carried out during the diagnostic routine in order to determine whether the magnitude of the input capacitance or the input impedance is in a predetermined permissibility range. In this case, the control unit can resort to the known methods for detecting the magnitude of a capacitance.

Alternatively or additionally, various embodiments can provide for the reaction of the sensor arrangement to predetermined control to be checked during the diagnostic routine. In this case, the level of the charging current, for example, can provide information relating to whether a high-impedance junction is incorrectly present at any point in the connection arrangement.

The input capacitance of the sensor arrangement primarily depends on the capacitance of the respective electrode with respect to ground potential but also on possible filter circuits assigned to the sensor arrangement according to an embodiment. Accordingly, the input capacitance may be subject to different influencing factors. In particular, it has been shown in practice that the input capacitance is often subject to a significant temperature drift. This is routinely insignificant to the determination of distance values during the measurement routine since the distance values can result only from a relative change in the capacitance of the relevant electrode with respect to the ground potential.

In order to be able to take into account influencing factors such as a temperature drift of the input capacitance during the diagnostic routine, the further configurations according to various embodiments provide a reference circuit which is controlled virtually in parallel with the sensor arrangement during the diagnostic routine.

In one variant, the reference circuit is configured according to an embodiment in such a manner that the reference capacitance of the reference circuit has a substantially identical temperature drift to the input capacitance of the sensor arrangement, with the result that it is possible to compensate for a possible temperature drift in the input capacitance using the reference circuit during the diagnostic routine.

In an embodiment, a control unit for controlling an above capacitive sensor arrangement of a motor vehicle for determining a distance to a measurement object is provided. The control unit is designed, in particular, to carry out the proposed method. In this respect, reference can be made to all statements made with respect to the proposed method.

In an embodiment, a sensor system of a motor vehicle having at least one capacitive sensor arrangement for determining a distance to a measurement object and having a control unit for controlling the sensor arrangement is provided. This sensor system is also designed, in particular, to carry out the proposed method, with the result that reference can again be made to all statements made with respect to the proposed method.

An embodiment provides a method for operating a capacitive sensor arrangement of a motor vehicle for determining a distance to a measurement object, a control unit for controlling the sensor arrangement being provided, the sensor arrangement having at least one electrode and a connection arrangement which is assigned to the electrode and has a connecting line and, in a manner coupled to the latter, a connection on the electrode side and a connection on the control unit side, the electrode being controlled during a measurement routine by means of the control unit and the resulting distance values being determined on the basis of a measurement capacitance formed by the electrode with respect to a reference potential, in particular with respect to ground potential, the electrical connection state of the electrode being checked with respect to the connection to the control unit during a diagnostic routine by means of the control unit, wherein the connection state is checked during the diagnostic routine by means of the control unit on the basis of the input capacitance between the connection on the control unit side and the reference potential.

In various embodiments, the input capacitance is the capacitive portion of the input impedance between the connection on the control unit side and the reference potential.

In various embodiments, the sensor arrangement has at least one filter circuit, in particular between the control unit and the connection arrangement or in the connection arrangement, wherein the filter circuit has a low-pass filter and/or a decoupling capacitor and/or an ESD protective element.

In various embodiments, the input capacitance and/or the input impedance is/are in a predetermined permissibility range in the case of a fault-free desired connection state, wherein the input capacitance or the input impedance between the connection on the control unit side and the reference potential is outside the permissibility range in the case of a faulty connection state, and wherein the connection state is detected as a faulty connection state by means of the control unit if the input capacitance or input impedance is outside the permissibility range.

In various embodiments, the input capacitance or the input impedance is determined by means of the control unit and is compared with the permissibility range for the input capacitance or for the input impedance in order to determine the connection state.

In various embodiments, the sensor arrangement is controlled with a diagnostic voltage and/or a diagnostic current by means of the control unit during the diagnostic routine and the connection state of the electrode is inferred from the resulting diagnostic current or the resulting diagnostic voltage.

In various embodiments, the control unit comprises a reference circuit, and wherein the reference circuit and the sensor arrangement are controlled with a diagnostic voltage or a diagnostic current by means of the control unit during the diagnostic routine for determining the connection state of the electrode, wherein the connection state of the electrode is inferred from the resulting measurement currents or measurement voltages, in particular by correlating, in particular comparing, the resulting measurement currents or measurement voltages with one another.

In various embodiments, the reference circuit and the sensor arrangement are controlled in an identical manner during the diagnostic routine by means of the control unit, wherein this control is identical to the control of the sensor arrangement during the measurement routine.

In various embodiments, the diagnostic voltage is a voltage jump or a voltage pulse or an AC voltage, or wherein the diagnostic current is a current step or a current pulse or an alternating current.

In various embodiments, the reference circuit provides a reference capacitance, in particular with respect to the reference potential, which is substantially identical to the input capacitance at least in an operating range, wherein the reference capacitance of the reference circuit has a substantially identical temperature drift to the input capacitance.

In various embodiments, the connection state of the electrode is inferred from the difference between the reference capacitance of the reference circuit and the input capacitance, in particular a difference or a ratio, during the diagnostic routine by means of the control unit.

In various embodiments, the reference circuit is a reference resonant circuit, and wherein the sensor arrangement is connected into the reference resonant circuit during the diagnostic routine by means of the control unit, wherein resulting detuning of the reference resonant circuit is determined by means of the control unit and is used to infer the connection state of the electrode.

In various embodiments, the reference circuit, in particular the reference capacitance, can be parameterized, wherein the input capacitance is determined during a learning routine and the reference circuit is then parameterized.

In various embodiments, the control unit has an integrated component with a computing unit for determining the connection state of the electrode, wherein the reference circuit is in the form of a discrete circuit separate from the integrated component, or wherein the reference circuit is part of the integrated component.

An embodiment provides a control unit for controlling a capacitive sensor arrangement of a motor vehicle for determining a distance to a measurement object, the sensor arrangement having at least one electrode and a connection arrangement which is assigned to the electrode and has a connecting line and, in a manner coupled to the latter, a connection on the electrode side and a connection on the control unit side, the control unit controlling the electrode during a measurement routine and determining the resulting distance values on the basis of a measurement capacitance formed by the electrode with respect to a reference potential, in particular with respect to ground potential, the control unit checking the electrical connection state of the electrode with regard to the connection to the control unit during a diagnostic routine, wherein the control unit checks the connection state during the diagnostic routine on the basis of the input capacitance between the connection on the control unit side and the reference potential.

An embodiment provides a sensor system of a motor vehicle having at least one capacitive sensor arrangement for determining a distance to a measurement object and having a control unit for controlling the sensor arrangement, the sensor arrangement having at least one electrode and a connection arrangement which is assigned to the electrode and has a connecting line and, in a manner coupled to the latter, a connection on the electrode side and a connection on the control unit side, the control unit controlling the electrode during a measurement routine and determining the resulting distance values on the basis of a measurement capacitance formed by the electrode with respect to a reference potential, in particular with respect to ground potential, the control unit checking the electrical connection state of the electrode with regard to the connection to the control unit during a diagnostic routine, wherein the control unit checks the connection state during the diagnostic routine on the basis of the input capacitance between the connection on the control unit side and the reference potential.

BRIEF DESCRIPTION OF THE FIGURES

The disclosed subject matter is explained in more detail below using a drawing which illustrates only exemplary embodiments and in which.

DETAILED DESCRIPTION

In order to carry out the proposed method, provision is made of a capacitive sensor arrangement 1 of a motor vehicle 2 which is used to determine a distance 3 to a measurement object, here an operator B. The sensor arrangement 1 is part of a control system 4 which is used to control a motorized closure element 5 of the motor vehicle 2. The control system 4 can be set up here to detect operating events and to control the motorized closure element 5 on the basis thereof. Such closure elements may be, for example, doors such as side and rear doors, in particular sliding doors, flaps, in particular tailgates, trunk lids, hoods, trunk floors or the like. In this respect, the term "closure element" can be broadly understood in the present case.

The motorized closure element 5 here can be a tailgate equipped with a tailgate drive 6.

In order to detect an operating event, which may be a foot movement of the operator B for example, the control system 4 resorts to the distance values determined by the sensor arrangement 1.

Figure 1:
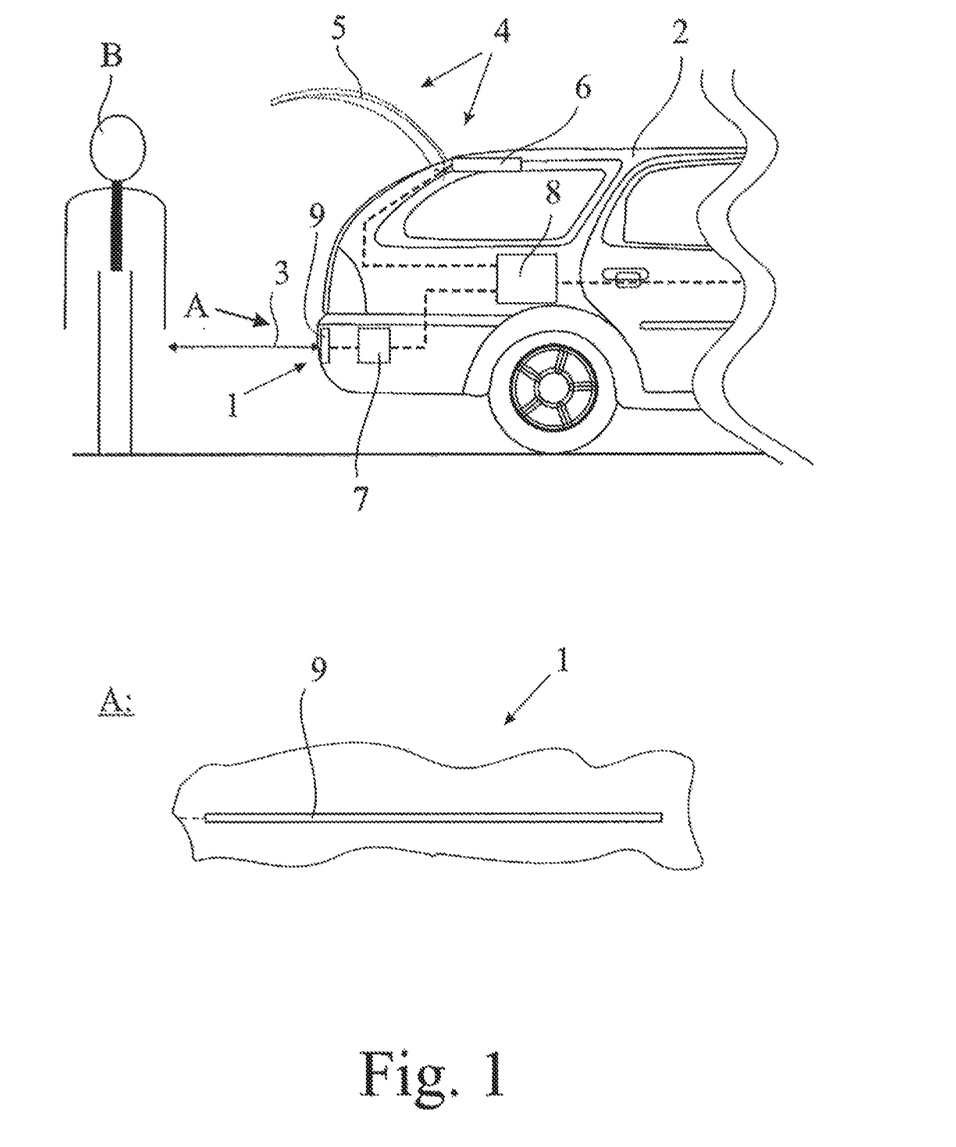
FIG. 1 shows the rear area of a motor vehicle having a proposed sensor system for carrying out the proposed method by means of a proposed control unit.

A control unit 7 is provided for the purpose of controlling the sensor arrangement 1. The control unit 7 here can be arranged separately from a superordinate controller 8 in the sense of a decentralized structure. In the exemplary embodiment illustrated in FIG. 1, the central controller 8 controls the tailgate drive 6 on the basis of control signals from the control unit 7. However, the control unit 7 may fundamentally also be part of the central controller 8.

The sensor arrangement 1 has at least one electrode 9 which here can be elongated. The electrode 9 in some embodiments runs along the closure element 5 and can also be arranged in or on a body part, in particular a bumper. The text below always refers to only one electrode 9. All relevant statements accordingly apply to all further electrodes which are possibly provided.

In order to electrically connect the electrode 9 to the control unit 7, the electrode 9 is assigned a connection arrangement 10 having a connecting line 11 and, in a manner coupled to the connecting line 11, a connection 12 on the electrode side and a connection 13 on the control unit side.

Figure 2:
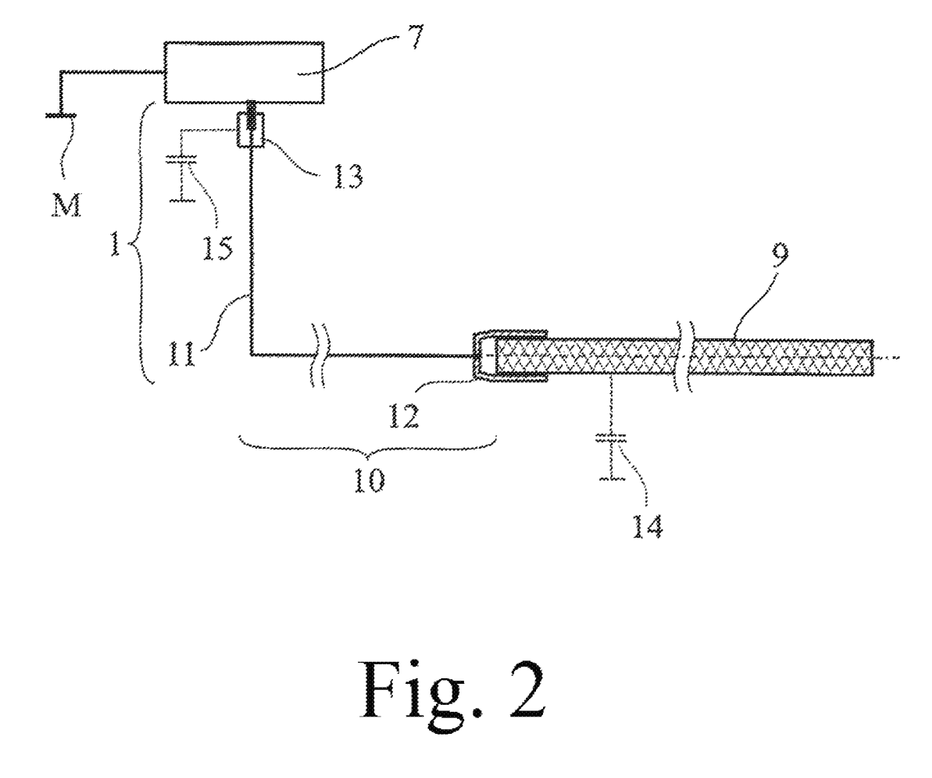
FIG. 2 shows a very schematic illustration of the control unit according to FIG. 1 with the sensor arrangement connected thereto.

During a measurement routine, the control unit 7 is used to control the electrode 9, the resulting distance values being determined on the basis of a measurement capacitance formed by the electrode 9 with respect to a reference potential, in particular with respect to ground potential M. The measurement capacitance, which is provided by the electrode 9 and whose magnitude changes if the respective measurement object B approaches, is only indicated by a dashed line in FIG. 2 and is provided with the reference symbol 14. The distance values determined during the measurement routine are used during the operating event monitoring discussed above.

In the present case, the check of the electrical connection state of the electrode 9 is at the forefront. In this case, the connection state comprises the state of the connections 12, 13, the state of the connecting line 11 and the state of the electrode 9. The intention is to check whether these components are actually in a conductive state and, in particular, whether high contact resistances result from inadequate connections, for example.

A diagnostic routine which is carried out by the control unit 7 is provided for the purpose of checking the connection state of the electrode 9. The important factor is that the connection state is checked during the diagnostic routine by the control unit 7 on the basis of the input capacitance between the connection 13 on the control unit side and the reference potential, here the ground potential M. The input capacitance is likewise only indicated by a dashed line in FIG. 2 and is provided with the reference symbol 15. The input capacitance 15 is therefore the capacitance on the input side of the sensor arrangement 1.

As discussed above, the proposal has recognized that a change in the connection state of the electrode 9 affects the magnitude and the charging behavior of the input capacitance 15 between the connection 13 on the control unit side and the ground potential M, that is to say the input impedance 15a between the connection 13 on the control unit side and the ground potential M.

According to the proposal, it is not absolutely necessary to determine the input capacitance 15 as such in the form of values during the diagnostic routine. The proposed teaching involves using the influence of a change in the connection state on the magnitude and the charging behavior of the input capacitance 15 to check the connection state.

The diagnostic routine can be carried out cyclically. In an embodiment, however, the diagnostic routine is carried out in a trigger-based manner, that is to say when a predetermined trigger event occurs.

The input capacitance 15 here can be the capacitive portion of the corresponding input impedance 15a between the connection 13 on the control unit side and the reference potential. The input impedance 15a is only indicated in FIGS. 3 and 4.

Figure 3:
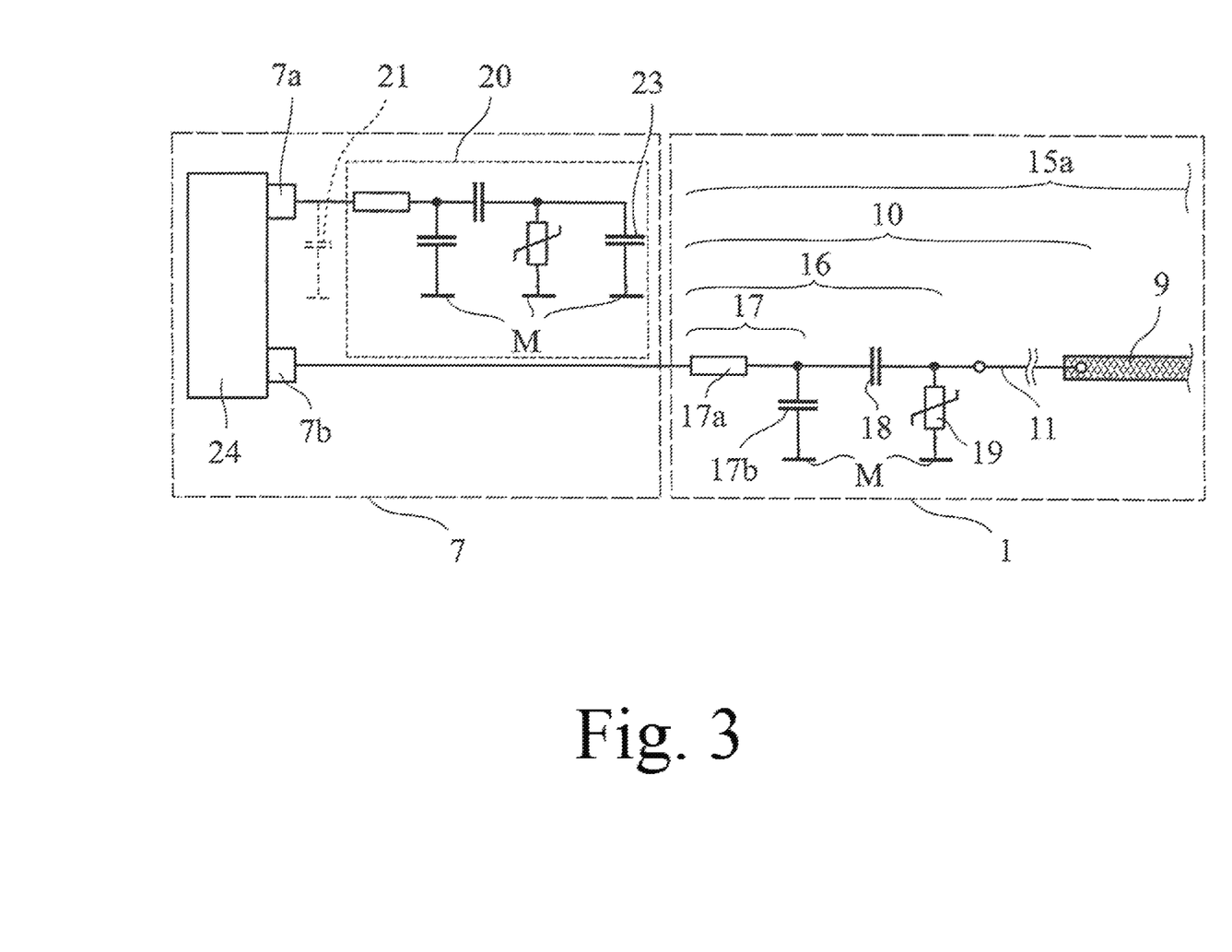
FIG. 3 shows the control unit according to FIG. 2 with the connected sensor arrangement in a greater degree of detail in a first embodiment.
Figure 4:
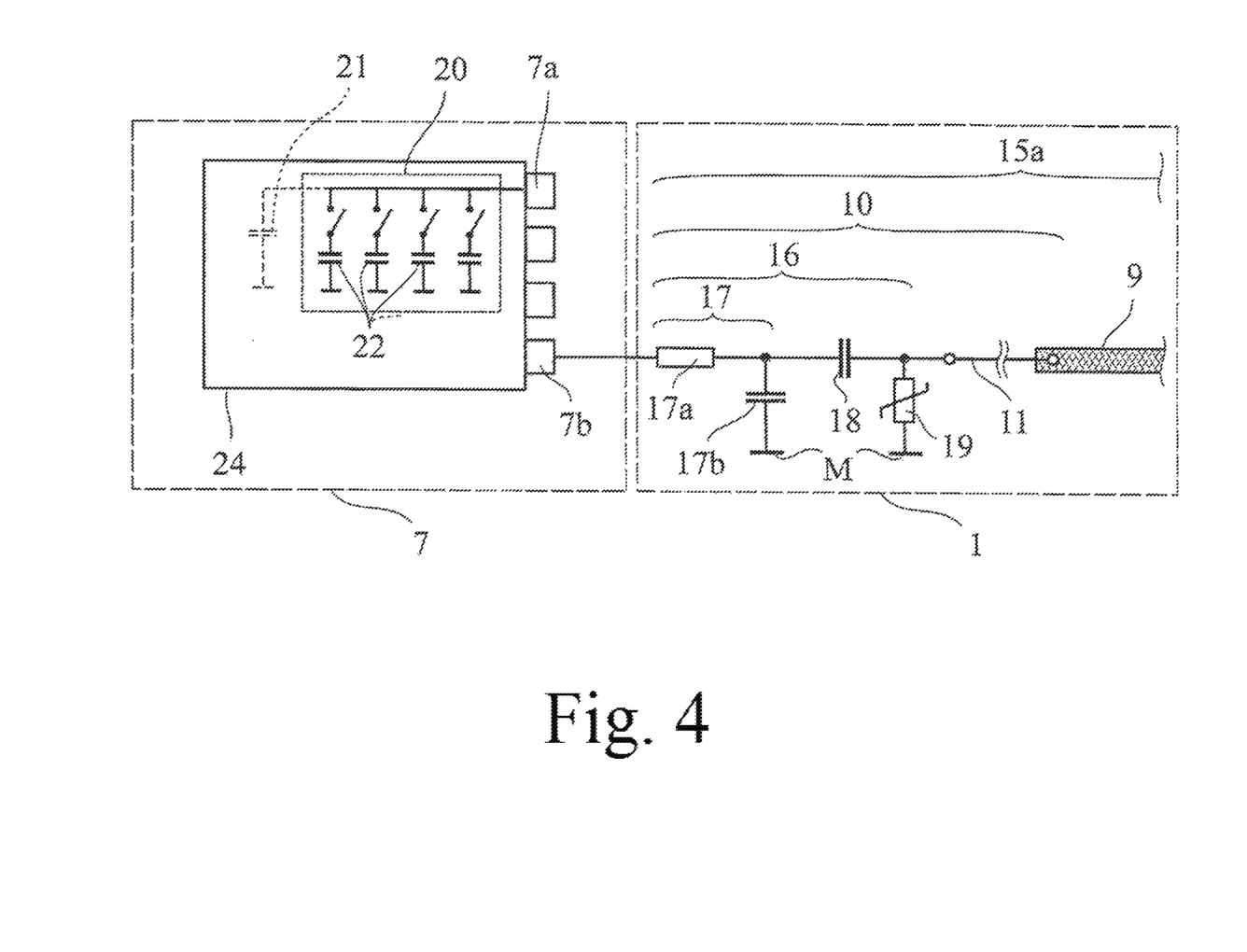
FIG. 4 shows the control unit according to FIG. 2 with the connected sensor arrangement in a greater degree of detail in a further embodiment.

FIGS. 3 and 4 show that the sensor arrangement 1 has a filter circuit 16, here between the control unit 7 and the connection arrangement 10. The filter circuit 16 can also be provided in the connection arrangement 10. In principle, a plurality of filter circuits 16 may also be provided here. The filter circuit here can have a low-pass filter 17 consisting of a resistor 17a and a capacitance 17b. The filter circuit 16 is also equipped with a decoupling capacitor 18 for decoupling the control unit 7 from DC voltage components which are possibly switched to the electrode 9. Finally, the filter circuit 16 has an ESD (electrostatic discharge) protective element 19 which, in the present case, is a varistor or a protective diode which is connected to ground potential M.

In principle, provision may be made for a faulty connection state to be detected by the control unit 7 by virtue of the input capacitance 15, in particular the input impedance 15a and also in particular its capacitive portion, changing in a predetermined manner.

Specifically, it may be advantageous for the input capacitance 15 and/or the input impedance 15a to be in a predetermined permissibility range in the case of a fault-free desired connection state of the electrode 9. The permissibility range may be defined by the magnitude of the input capacitance 15 in a predetermined temperature range of the ambient temperature of the motor vehicle 2. In this case, provision can be made for the input capacitance 15 and/or the input impedance 15a to be outside the permissibility range, here below the permissibility range, in the case of a faulty connection state, for example in the case of a cable break in the connecting line 11. This is accordingly detected as a faulty connection state by the control unit 7. For this purpose, in one variant, the input capacitance 15 is determined by the control unit 7 and is compared with the permissibility range for the input capacitance 15 in order to determine the connection state of the electrode 9. Various variants which can be easily implemented in terms of circuitry are known for the purpose of determining the input capacitance 15 between the connection 13 on the control unit side and the ground potential M.

Alternatively or additionally, provision may be made for the sensor arrangement 1 to be controlled with a diagnostic voltage and/or with a diagnostic current during the diagnostic routine by the control unit 7, that is to say via the connection 13 on the control unit side, the connection state of the electrode 9 being inferred from the resulting diagnostic current or the resulting diagnostic voltage. In this context, it is conceivable for a high contact resistance, for example at the connection 12 on the electrode side, to result in a relatively low charging current when controlling the connection arrangement 10 with a diagnostic voltage. This low charging current can be detected as a fault state by the control unit 7.

FIGS. 3 and 4 show that the control units 7 there each comprise a reference circuit 20. In this case, provision is made for both the reference circuit 20 and the sensor arrangement 1 to be controlled with a diagnostic voltage or a diagnostic current during the diagnostic routine for determining the connection state of the electrode 9 by the control unit 7. For this purpose, the control unit 7 has accordingly controllable measurement ports 7a, 7b for the reference circuit 20, on the one hand, and for the connection arrangement 10, on the other hand, which are used both to control the reference circuit 20 with voltages and/or currents and the sensor arrangement 1 and to record the resulting measurement currents or measurement voltages. In this respect, the measurement ports 7a are each both a measurement output and a measurement input.

As discussed above, the connection state of the electrode 9 is inferred from the resulting measurement currents or measurement voltages. In this case, the resulting measurement currents or measurement voltages, which are assigned to the reference circuit 20, on the one hand, and are assigned to the connection arrangement 10, on the other hand, are correlated with one another in order to be able to infer the connection state of the electrode 9. In the present case, the term "correlated" comprises any processing of the relevant measurement currents or measurement voltages with one another which provides information relating to a predetermined relationship between the respective size of the reference circuit 20 and the sensor arrangement 1. In the simplest case, the resulting measurement currents or measurement voltages are compared with one another during the correlation.

A configuration which is particularly simple in terms of control results from the fact that the reference circuit 20 and the sensor arrangement 1 are controlled in an identical manner during the diagnostic routine by the control unit 7. This identical control can be carried out at the same time or with a delay. In an embodiment, this control is identical to the control of the sensor arrangement 1 during the measurement routine. Ultimately, it is therefore the case that the control unit 7 respectively controls the reference circuit 20, on the one hand, and the sensor arrangement 1, on the other hand, in order to determine distance values to a measurement object B. An embodiment accordingly provides for the control unit 7 to actually determine the distance values during the diagnostic routine and to process them, in particular compare them with one another, in order to determine the connection state.

It can be pointed out that the term "diagnostic voltage" can be broadly understood in the present case and can comprise a voltage jump, a voltage pulse or an AC voltage. The only important factor is that the diagnostic voltage comprises a change, with the result that at least one charging or discharging operation of the input capacitance 15 can be detected. The term "diagnostic current" can also be broadly understood. It accordingly comprises a current step, a current pulse or an alternating current.

The reference circuit 20 in some embodiments constitutes a circuitry simulation of the sensor arrangement 1 at least to a certain degree. Accordingly, provision can be made for the reference circuit 20 to provide a reference capacitance, here can be with respect to ground potential M, which is substantially identical to the input capacitance 15 at least in an operating range. It can be the case that the reference circuit has an impedance which is substantially identical to the input impedance 15a of the sensor arrangement at least in an operating range.

In the reference circuit 20 shown in FIG. 3, the reference capacitance 21 is the resulting capacitance which is present with respect to ground potential M at the input of the reference circuit 20 and is illustrated by a dashed line in FIG. 3. In the exemplary embodiment which is illustrated in FIG. 4, the reference capacitance 21 is the sum of the individual capacitances 22 which are illustrated in FIG. 4 and are each activated via the switching elements 22a, as is also explained.

In various embodiments, the arrangement is now such that the reference capacitance 21 of the reference circuit 20 has a substantially identical temperature drift to the input capacitance 15 at least over a predetermined temperature range of the ambient temperature of the motor vehicle 2. This makes it possible to ensure that temperature effects do not influence the determination of the connection state of the electrode 9.

In the simplest case, the connection state of the electrode 9 is inferred from the difference between the reference capacitance 21 of the reference circuit 20 and the input capacitance 15 during the diagnostic routine by the control unit 7. In this case, the term "difference" can be broadly understood. It comprises, for example, a difference between the reference capacitance 21 and the input capacitance 15. However, in another embodiment, it also comprises a ratio between the reference capacitance 21 and the input capacitance 15.

In the embodiment according to FIG. 3, the reference circuit 20 also comprises a simulation of the measurement capacitance 14 in addition to a simulation of the filter circuit 16. In addition, the reference circuit 20 may also comprise a circuitry simulation of the connection arrangement 10 (not illustrated). In contrast, in the configuration illustrated in FIG. 4, the reference circuit 20 comprises only a simulation of the measurement capacitance 14 which then results from the sum of the individual capacitances 22 each activated via the switching elements 22a.

In principle, the reference circuit 20 may be in the form of a reference resonant circuit (not illustrated), the sensor arrangement 1 being connected into the reference resonant circuit during the diagnostic routine by the control unit 7. The reference resonant circuit can be configured in such a manner that a change in the input capacitance 15 is associated with detuning of the reference resonant circuit. In this case, provision can be made for resulting detuning of the reference resonant circuit to be determined by the control unit 7 and to be used to infer the connection state of the electrode 9.

In principle, provision may be made for the reference circuit 20, potentially the reference capacitance 21 here, to be able to be parameterized. This is provided in FIG. 4 by the plurality of individual capacitances 22 which can each be connected together by means of a switching element 22a to form the resulting reference capacitance 21. It is therefore readily possible for the input capacitance 15 of the sensor arrangement 1 to be determined during a learning routine and for the reference circuit 20 to then be parameterized. This is particularly simple if, as illustrated in FIGS. 3 and 4, the control unit 7 has an integrated component 24 with a computing unit for determining the connection state of the electrode 9. As a result of the fact that the reference circuit 20 is part of the integrated component 24 in the configuration shown in FIG. 4, the reference capacitance 21 can be easily adjusted using software. The connection of the reference capacitance 21 to the measurement port 7a can then also be adjusted using software.

However, in the configuration which is illustrated in FIG. 3 and can be in this respect, the reference circuit 20 is in the form of a discrete circuit separate from the integrated component 24, which is advantageous in so far as this results in a particularly high degree of flexibility in the circuitry simulation of the sensor arrangement 1 discussed above. In this context, it can be pointed out that, although the filter circuit 16 is assigned to the sensor arrangement 1 in the present case, it can be arranged on a printed circuit board of the control unit 7 in the specific implementation.

According to another teaching, the control unit 7 discussed above for controlling the capacitive sensor arrangement 1 is disclosed. Reference can be made to all statements made above with respect to the control unit 7.

According to another teaching, the sensor system 4 of a motor vehicle 2 having the at least one capacitive sensor arrangement 1 is disclosed. Reference can again be made to all statements made with respect to the sensor arrangement 1 and the control unit 7.

The invention claimed is:

1. A method for operating a capacitive sensor arrangement of a motor vehicle for determining a distance to a measurement object, comprising:
performing a measurement routine; and
performing a diagnostic routine;
wherein a control unit for controlling the sensor arrangement is provided, the sensor arrangement having at least one electrode and a connection arrangement which is assigned to the electrode and has a connecting line and, in a manner coupled to the latter, a connection on the electrode side and a connection on the control unit side, the electrode being controlled during the measurement routine by the control unit and the resulting distance values being determined on the basis of a measurement capacitance formed by the electrode with respect to a reference potential, the electrical connection state of the electrode being checked with respect to the connection to the control unit during the diagnostic routine by means of the control unit,
wherein the connection state is checked during the diagnostic routine by the control unit on the basis of the input capacitance between the connection on the control unit side and the reference potential.

2. The method as claimed in claim 1, wherein the input capacitance is the capacitive portion of the input impedance between the connection on the control unit side and the reference potential.

3. The method as claimed in claim 1, wherein the sensor arrangement has at least one filter circuit.

4. The method as claimed in claim 1, wherein the input capacitance and/or the input impedance is/are in a predetermined permissibility range in the case of a fault-free desired connection state, wherein the input capacitance or the input impedance between the connection on the control unit side and the reference potential is outside the permissibility range in the case of a faulty connection state, and wherein the connection state is detected as a faulty connection state by the control unit if the input capacitance or input impedance is outside the permissibility range.

5. The method as claimed in claim 4, wherein the input capacitance or the input impedance is determined by the control unit and is compared with the permissibility range for the input capacitance or for the input impedance in order to determine the connection state.

6. The method as claimed in claim 1, wherein the sensor arrangement is controlled with a diagnostic voltage and/or a diagnostic current by the control unit during the diagnostic routine and the connection state of the electrode is inferred from the resulting diagnostic current or the resulting diagnostic voltage.

7. The method as claimed in claim 1, wherein the control unit comprises a reference circuit, and wherein the reference circuit and the sensor arrangement are controlled with a diagnostic voltage or a diagnostic current by the control unit during the diagnostic routine for determining the connection state of the electrode.

8. The method as claimed in claim 6, wherein the reference circuit and the sensor arrangement are controlled in an identical manner during the diagnostic routine by the control unit.

9. The method as claimed in claim 6, wherein the diagnostic voltage is a voltage jump or a voltage pulse or an AC voltage, or wherein the diagnostic current is a current step or a current pulse or an alternating current.

10. The method as claimed in claim 1, wherein the reference circuit provides a reference capacitance, which is substantially identical to the input capacitance at least in an operating range.

11. The method as claimed in claim 1, wherein the connection state of the electrode is inferred from the difference between the reference capacitance of the reference circuit and the input capacitance during the diagnostic routine by the control unit.

12. The method as claimed in claim 1, wherein the reference circuit is a reference resonant circuit, and wherein the sensor arrangement is connected into the reference resonant circuit during the diagnostic routine by the control unit.

13. The method as claimed in claim 1, wherein the reference circuit can be parameterized.

14. The method as claimed in claim 1, wherein the control unit has an integrated component with a computing unit for determining the connection state of the electrode.

15. A control unit for controlling a capacitive sensor arrangement of a motor vehicle for determining a distance to a measurement object, the sensor arrangement having at least one electrode and a connection arrangement which is assigned to the electrode and has a connecting line and, in a manner coupled to the latter, a connection on the electrode side and a connection on the control unit side, the control unit controlling the electrode during a measurement routine and determining the resulting distance values on the basis of a measurement capacitance formed by the electrode with respect to a reference potential, the control unit checking the electrical connection state of the electrode with regard to the connection to the control unit during a diagnostic routine, wherein the control unit checks the connection state during the diagnostic routine on the basis of the input capacitance between the connection on the control unit side and the reference potential.

16. A sensor system of a motor vehicle having at least one capacitive sensor arrangement for determining a distance to a measurement object and having a control unit for controlling the sensor arrangement, the sensor arrangement having at least one electrode and a connection arrangement which is assigned to the electrode and has a connecting line and, in a manner coupled to the latter, a connection on the electrode side and a connection on the control unit side, the control unit controlling the electrode during a measurement routine and determining the resulting distance values on the basis of a measurement capacitance formed by the electrode with respect to a reference potential, the control unit checking the electrical connection state of the electrode with regard to the connection to the control unit during a diagnostic routine, wherein the control unit checks the connection state during the diagnostic routine on the basis of the input capacitance between the connection on the control unit side and the reference potential.

17. The method as claimed in claim 3, wherein the filter circuit has a low-pass filter and/or a decoupling capacitor and/or an ESD protective element.

18. The method as claimed in claim 7, wherein the connection state of the electrode is inferred from the resulting measurement currents or measurement voltages, the resulting measurement currents or measurement voltages with one another.

19. The method as claimed in claim 8, wherein this control is identical to the control of the sensor arrangement during the measurement routine.

20. The method as claimed in claim 10, wherein the reference capacitance of the reference circuit has a substantially identical temperature drift to the input capacitance.

* * * * *